United States Patent
Marrow et al.

(10) Patent No.: US 10,298,240 B1
(45) Date of Patent: *May 21, 2019

(54) WIDE FREQUENCY RANGE CLOCK GENERATION WITH PHASE INTERPOLATION

(71) Applicant: Seagate Technology LLC, Cupertino, CA (US)

(72) Inventors: Marcus Marrow, San Jose, CA (US); Kenneth John Evans, San Jose, CA (US); Jason Vincent Bellorado, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/950,766

(22) Filed: Apr. 11, 2018

Related U.S. Application Data

(63) Continuation of application No. 15/390,453, filed on Dec. 23, 2016, now Pat. No. 9,954,537.

(51) Int. Cl.
| | |
|---|---|
| *H03L 7/081* | (2006.01) |
| *H03L 7/08* | (2006.01) |
| *H03K 5/135* | (2006.01) |
| *G06F 1/04* | (2006.01) |

(52) U.S. Cl.
CPC .................. *H03L 7/08* (2013.01); *G06F 1/04* (2013.01); *H03K 5/135* (2013.01); *H03L 7/0814* (2013.01)

(58) Field of Classification Search
CPC .......... H03L 7/08; H03L 7/081–7/1818; H03L 7/18; H03K 5/135
See application file for complete search history.

(56) References Cited

U.S. PATENT DOCUMENTS

| | | | |
|---|---|---|---|
| 5,563,746 | A | 10/1996 | Bliss |
| 5,726,818 | A | 3/1998 | Reed et al. |
| 5,754,352 | A | 5/1998 | Behrens et al. |
| 5,793,548 | A | 8/1998 | Zook |
| 5,822,142 | A | 10/1998 | Hicken |
| 5,909,332 | A | 6/1999 | Spurbeck et al. |
| 5,954,837 | A | 9/1999 | Kim |
| 6,069,758 | A | 5/2000 | Chung |
| 6,172,836 | B1 | 1/2001 | Bang |
| 6,275,346 | B1 | 8/2001 | Kim et al. |
| 6,307,696 | B1 | 10/2001 | Bishop et al. |

(Continued)

*Primary Examiner* — Patrick O Neill
(74) *Attorney, Agent, or Firm* — Cesari & Reed, LLP; Kirk A. Cesari

(57) ABSTRACT

In certain embodiments, an apparatus may comprise a circuit configured to scale a phase control value from an external phase control resolution of an external clock frequency to an internal phase control resolution of an internal clock frequency to generate a target phase control value. The circuit may also determine a difference between a current phase control value and the target phase control value and determine a phase step value based on the difference. Further, the circuit may modify a current phase control value based on the phase step value and generate a phase controlled clock signal at the internal clock frequency using the modified phase control value. Additionally, the circuit may divide the phase controlled clock signal at the internal clock frequency to generate a phase controlled clock signal at the external clock frequency.

20 Claims, 5 Drawing Sheets

(56) References Cited

U.S. PATENT DOCUMENTS

| | | |
|---|---|---|
| 6,353,649 B1 | 3/2002 | Bockleman et al. |
| 6,480,349 B1 | 11/2002 | Kim et al. |
| 6,594,094 B2 | 7/2003 | Rae et al. |
| 6,594,098 B1 | 7/2003 | Sutardja |
| 6,760,185 B1 | 7/2004 | Roth et al. |
| 6,973,150 B1 | 12/2005 | Thuringer |
| 6,996,193 B2 | 2/2006 | Yamagata et al. |
| 7,035,029 B2 | 4/2006 | Sawada et al. |
| 7,068,461 B1 | 6/2006 | Chue et al. |
| 7,199,956 B1 | 4/2007 | Moser et al. |
| 7,602,568 B1 | 10/2009 | Katchmart |
| 7,643,548 B2 | 1/2010 | Hafeez |
| 7,665,007 B2 | 2/2010 | Yang et al. |
| 7,738,538 B1 | 6/2010 | Tung |
| 7,917,563 B1 | 3/2011 | Shih et al. |
| 7,995,691 B2 | 8/2011 | Yang |
| 7,997,582 B2 | 8/2011 | Wong |
| 8,077,571 B1 | 12/2011 | Xia et al. |
| 8,139,305 B2 | 3/2012 | Mathew et al. |
| 8,266,505 B2 | 9/2012 | Liu et al. |
| 8,400,726 B1 | 3/2013 | Wu et al. |
| 8,516,347 B1 | 8/2013 | Li et al. |
| 8,625,216 B2 | 1/2014 | Zhang et al. |
| 9,043,688 B1 | 5/2015 | Chan et al. |
| 9,129,646 B2 | 9/2015 | Mathew et al. |
| 9,236,952 B2 | 1/2016 | Sun et al. |
| 9,362,933 B1 | 6/2016 | Chaichanavong |
| 9,613,652 B2 | 4/2017 | Link et al. |
| 9,954,537 B1 * | 4/2018 | Marrow .................. H03L 7/08 |
| 2003/0185291 A1 | 10/2003 | Nakahira et al. |
| 2004/0047403 A1 | 3/2004 | Choi et al. |
| 2007/0018733 A1 | 1/2007 | Wang et al. |
| 2009/0268857 A1 | 10/2009 | Chen et al. |
| 2010/0138722 A1 | 6/2010 | Harley et al. |
| 2010/0211830 A1 | 8/2010 | Sankaranarayanan et al. |
| 2010/0272150 A1 | 10/2010 | Kil et al. |
| 2013/0182347 A1 | 7/2013 | Maeto |
| 2013/0339827 A1 | 12/2013 | Han et al. |
| 2014/0337676 A1 | 11/2014 | Yen et al. |
| 2014/0355147 A1 | 12/2014 | Cideciyan et al. |
| 2015/0124912 A1 | 5/2015 | Eliaz et al. |
| 2015/0179213 A1 | 6/2015 | Liao et al. |
| 2016/0055882 A1 | 2/2016 | Cideciyan et al. |
| 2016/0134449 A1 | 5/2016 | Liu et al. |
| 2016/0293205 A1 | 10/2016 | Jury et al. |
| 2017/0162224 A1 | 6/2017 | Mathew et al. |

\* cited by examiner

WIDE FREQUENCY RANGE CLOCK GENERATION WITH PHASE INTERPOLATION

CROSS-REFERENCE TO RELATED APPLICATIONS

This application is a continuation of and claims priority to co-pending U.S. patent application Ser. No. 15/390,453, entitled "WIDE FREQUENCY RANGE CLOCK GENERATION WITH PHASE INTERPOLATION", which was filed Dec. 23, 2016, the contents of which is incorporated herein by reference in its entirety.

SUMMARY

In certain embodiments, an apparatus may comprise a circuit configured to scale a phase control value from an external phase control resolution of an external clock frequency to an internal phase control resolution of an internal clock frequency to generate a target phase control value. The circuit may also determine a difference between a current phase control value and the target phase control value and determine a phase step value based on the difference. Further, the circuit may modify a current phase control value based on the phase step value and generate a phase controlled clock signal at the internal clock frequency using the modified phase control value. Additionally, the circuit may divide the phase controlled clock signal at the internal clock frequency to generate a phase controlled clock signal at the external clock frequency.

In certain embodiments, an apparatus may comprise an internal clock configured to generate an internal clock signal at an internal clock frequency. Further, the apparatus may comprise a digital to phase circuit configured to scale a phase control value from an external phase control resolution of an external clock frequency to an internal phase control resolution of the internal clock frequency to generate a target phase control value, determine a difference between a current phase control value and the target phase control value, determine a phase step value based on the difference, modify a current phase control value based on the phase step value, and generate a phase controlled clock signal at the internal clock frequency using the modified phase control value. In addition, the apparatus may comprise a frequency divider configured to divide the phase controlled clock signal at the internal clock frequency to generate a phase controlled clock signal at the external clock frequency.

In certain embodiments, a method may comprise scaling a phase control value from an external phase control resolution of an external clock frequency to an internal phase control resolution of an internal clock frequency to generate a target phase control value. The method may include determining a difference between a current phase control value and the target phase control value and determining a phase step value based on the difference. The method may then include generating a phase controlled clock signal at the internal clock frequency using the modified phase control value and dividing the phase controlled clock signal at the internal clock frequency to generate a phase controlled clock signal at the external clock frequency.

DETAILED DESCRIPTION

Figure 1:
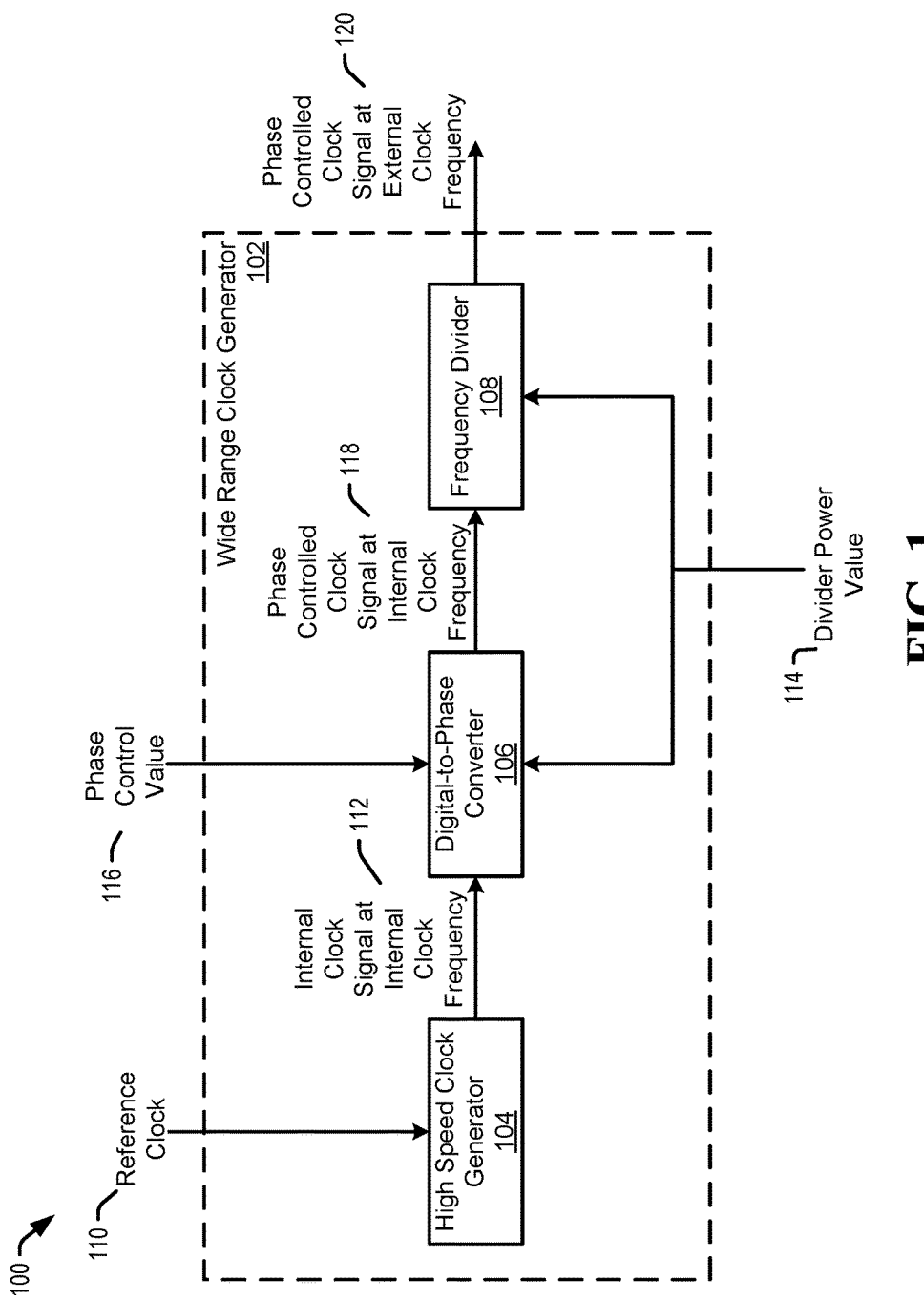
FIG. 1 is a block diagram of a system including a tunable clock generator with phase control, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to clock generation, and in some embodiments, the present disclosure relates to a tunable clock generator, such as a phase locked loop, with phase interpolation. Some systems, such as electrical, electronic, motor drive, processing, or other systems may include clock generators. In some such systems, it is desirable for those clock generators to have variable frequencies.

In general, two issues may arise when designing a clock generator with a wide tunable frequency range. First, in some cases, the frequency range may be provided by a variation in the ring oscillator bias current or voltage. A large variation in the ring oscillator bias current or voltage may cause poor jitter performance at low input biases because the maximum bias may be dictated by transistor reliability. Second, controlling the clock phase may be difficult. It may be desirable in some systems to have phase control, such as in systems where the clock is recovered from a read back signal and detection may rely on a synchronous phase lock. In some cases, providing a tunable frequency range by mapping to a range in the period between edge may result in unacceptable integrated non-linearity for the phase interpolator. Some embodiments disclosed herein may provide clock generators without such issues.

Some embodiments may include an internal clock that provides an internal clock signal at a higher frequency than the external or output clock frequency of the clock generator. Such embodiments may include a frequency divider that may divide the clock frequency down to the external clock frequency. In addition, in some embodiments, the divider may receive a divider power that is used to determine the output clock frequency. In some examples, the ratio of the internal clock frequency to the external clock frequency may be a power of two and the divider for value may determine the power of two of the ratio.

Further, some embodiments may provide for phase interpolation. In some examples, the phase interpolation may be performed on the high frequency clock signal. In some embodiments, the phase interpolation may behave, from an external viewpoint, as if implemented on the external frequency clock signal.

The following examples may be discussed in the context of the read/write channel of a hard disk drive. However, this is merely for ease of discussion and context. Further, embodiments of the disclosed subject matter are not limited to this context.

Referring to FIG. 1, a block diagram of a system including a wide range clock generator with phase control is shown and is generally designated 100. More particularly, the system 100 may include a wide range clock generator 102. The wide range clock generator 102 may include a high-speed clock generator 104, a digital-to-phase converter 106 and a frequency divider 108.

Each of the high-speed clock generator 104, digital-to-phase converter 106, and frequency divider 108 may be a separate circuit, part of a system on chip (SOC), firmware, a processor(s), or other system not listed, or any combination thereof.

During operation, the high-speed clock generator 104 may receive a reference clock signal 110. Based on the reference clock signal 110, the high-speed clock generator 104 may generate an internal clock signal 112 at an internal frequency. In some embodiments, the high-speed clock generator 104 may be a phase locked loop. For example, in some examples, the high-speed clock generator 104 may be a narrow tuning range high-speed phase locked loop (PLL).

The digital-to-phase converter 106 may receive the internal clock signal 112 at the internal clock frequency, a divider power value 114 and a phase control value 116 and generate a phase controlled clock signal 118 at the internal clock frequency.

The divider power value 114 may indicate the external clock frequency (also referred to herein as the output or desired clock frequency). For example, where the ratio of the external clock frequency to the internal clock frequency is a power of two, the divider power value may be the value of the exponent of the power of two. In other words, the divider power value 114 may be the exponent value (P) where the ratio (R) of the external clock frequency (EF) to the internal clock frequency (IF) may be written as:

$$R = \frac{EF}{IF} = 2^P$$

The phase control value 116 may represent a desired phase shift of the phase controlled clock signal at the external clock frequency 120 being output by the wide range clock generator 102. In some examples, the phase control value 116 may be received in an external phase control resolution. In some embodiments, the-digital-to-phase converter 106 may convert or scale the phase control value 116 into an internal phase control resolution which may be a finer resolution than the external phase control resolution. The digital phase converter 106 may then perform phase control operations at the finer resolution while appearing to perform phase control at the external phase control resolution from the perspective of an outside system.

The-digital-to-phase converter 106 may utilize the phase control value 116 to generate the phase controlled clock signal 118 at the internal clock frequency. More particularly the digital phase converter 106 may generate the phase controlled clock signal 118 at the internal clock frequency by shifting or offsetting a phase of the phase controlled clock signal 118 from a phase of the internal clock signal 112 based on the phase control value 116. In some embodiments, the changing of the phase of the phase controlled clock signal 118 may be performed in a stepwise manner. More details regarding an example of the operation of the digital-to-phase converter 106 are provided below with regard to FIG. 2.

The frequency divider 108 may receive the divider power value 114 and the phase controlled clock signal 118 at the internal clock frequency and generate the phase controlled clock signal 120 at the external clock frequency. In some examples, the frequency divider 108 may divide the frequency of the phase controlled clock signal 118 at the internal clock frequency according to the divider power value 114. For example, the frequency divider 108 may divide the frequency of the phase controlled clock signal 118 by $2^P$ to generate the phase controlled clock signal 120 at the external clock frequency, where P is the divider power value 114.

Figure 2:
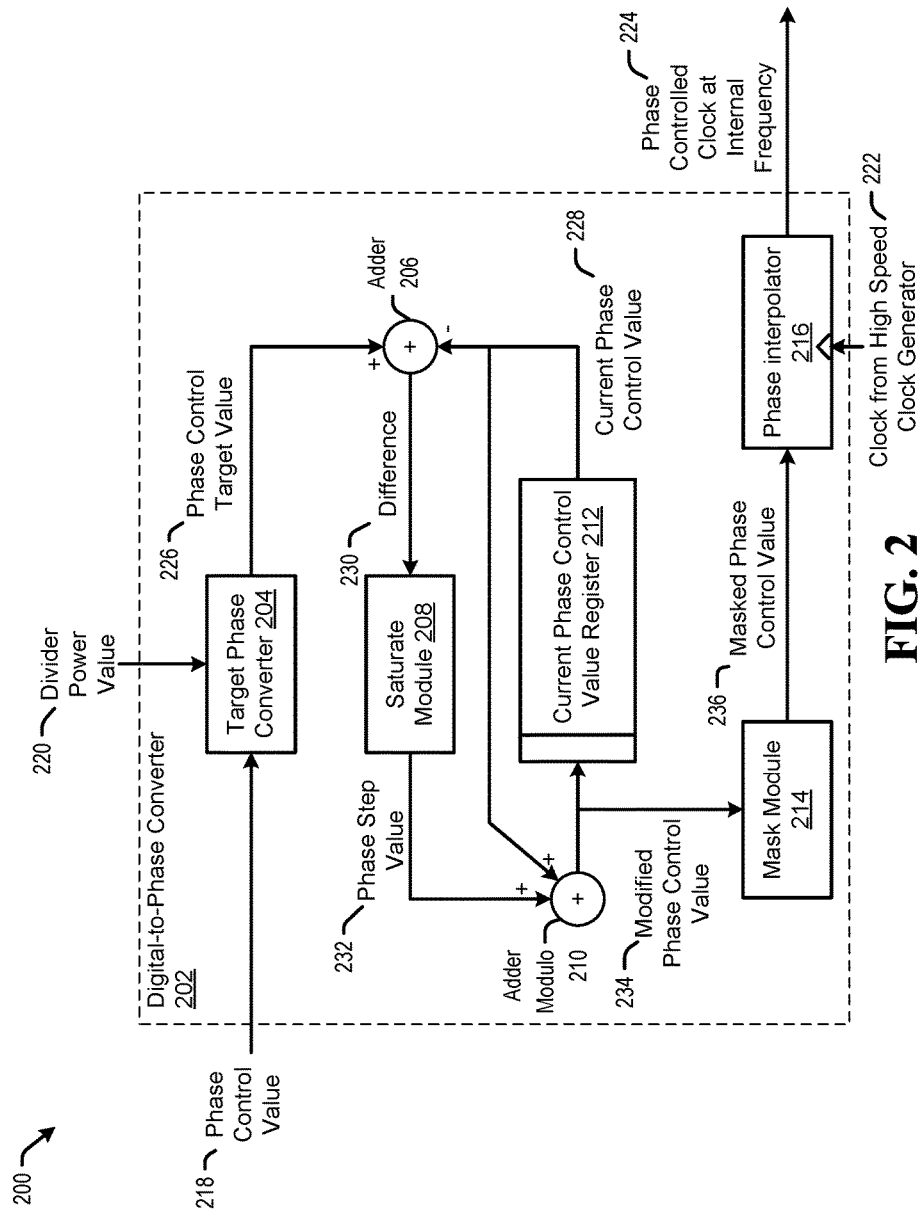
FIG. 2 is a block diagram of a system including a digital-to-phase converter of a tunable clock generator with phase control, in accordance with certain embodiments of the present disclosure.

Referring to FIG. 2, a block diagram of a system including a digital-to-phase converter of a tunable clock generator with phase control is shown and is generally designated 200. More particularly, system 200 may include a digital-to-phase converter 202 that may operate in a similar manner to that described above with regard to FIG. 1. The digital to-phase converter 202 may include a target phase converter 204, an adder 206, a saturate module 208, an adder modulo 210, a current phase control value register 212, a mask module 214 and a phase interpolator 216.

The target phase converter 204 may be coupled to the adder 206. The adder 206 may be coupled to the saturate module 208 which may be coupled to the adder modulo 210. The adder modulo 210 may be coupled to the current phase control value register 212 which may be coupled to the adder 206 and the adder modulo 210. The adder modulo 210 may further be coupled to the mask module 214. The mask module 214 may be coupled to the phase interpolator 216.

Each of the target phase converter 204, adder 206, saturate module 208, adder modulo 210, current phase control value register 212, mask module 214 and phase interpolator 216 may be a separate circuit, part of a system on chip (SOC), firmware, a processor(s), or other system not listed, or any combination thereof.

The digital-to-phase converter 202 may receive a phase control value 218, a divider power value 220 and an internal clock signal from a high-speed clock generator 222 and output a phase controlled clock signal 224 at the internal clock frequency. For ease of understanding, the following discussion of the digital-to-phase converter 202 will be in the context of a non-limiting example in which the phase control value 218 is a six-bit signal. As such, the external phase control resolution in the example allows for $2^6$ phases at the external frequency. The divider power value 220 in the example context is a three-bit signal and may have values between zero and five with the example divider value 220 being three. The divider power 220 is not limited to this example embodiment and may have higher or lower values and/or bit widths. Further, in some examples, the maximum value or range of values of the divider 220 may track the lowest clock frequency of the system. In addition, the phase interpolator 216 in this example context provides $2^6$ phases at the internal clock frequency.

In operation, the target phase converter 204 receives the phase control value 218 and the divider power value 220 and generates a phase control target value 226. Where the phase control value 218 is an M-bit signal, the divider power value 220 is a value P in a range from zero to N, and the phase interpolator 216 provides $2^R$ phases at the internal clock frequency, the phase control target value 226 may be a (N+R) bit signal. In the context of the example given above, the phase control target value 226 may be an 11-bit signal (e.g., N+R=5+6). The target phase converter 204 may generate the phase control target value 226 to have the form, {(N−S) zeros, the bits of value 218, (N+S) zeros} where S=R−M. In the example context discussed above, the content of the phase control target value 226 may be generated as {two 0's, (six bits of value 218), three 0's}.

The adder 206 may operate to subtract the current phase control value 228 stored in the current phase control value register 212 from the phase control target value 226 and output the difference 230 to the saturate module 208.

The saturate module 208 may operate to determine a phase step value 232 based on the difference 230. In particular, the example embodiment illustrated in FIG. 2 may operate to perform a series of steps in shifting the phase of the phase controlled clock signal 224 to the desired phase represented by the phase control target value 226 instead of making the shift in one operation. Performing the shift in a stepwise manner may improve the stability of the system. For example, performing a large phase shift as a single operation could more than double the frequency of the clock signal. Such a shortened period may not be sufficient time for operations to complete. In such a case, the state of the system may become corrupted resulting in a reset or crash. As such, in some embodiments, the phase step value 232 may have a range. The range may be determined based on the ability of the system operating using the phase controlled clock 224 to handle phase shifts. For example, a system may be able to handle two steps at the internal phase control resolution at a time. In such a case, the range of values for the phase step value 232 may be from negative two to positive two.

If the difference 230 is within the range of values for the phase step value 232, the saturate module may determine the phase step value 232 to be the difference 230. Otherwise, the saturate module 208 may determine the phase step value 232 to be the maximum positive step or minimum negative step in the range. Because of the cyclic nature of clock phase, the saturate module 208 may choose the direction of the step in a variety of ways (or even always step one direction).

In general terms, the saturate module 208 may choose the smallest shift to reduce the difference 230 to zero (e.g. chose to shift forward or backward). For example, in some embodiments, the difference 230 may be a (N+R+1) bit two's complement signal. In the example context discussed above, the difference 230 may be a 12-bit two's complement signal (e.g. (6+5+1)-bits). To determine the step direction, the saturate module 208 may perform a modulo operation:

$$Z = X \text{ modulo } 2^{P+R}$$

where X is the difference value 230. The saturate module may then determine if the $(P+R)^{th}$-bit of Z is a one or zero. If the $(P+R)^{th}$-bit of Z is a zero, the phase step value 232 may be determined to be negative or backward. If the $(P+R)^{th}$-bit of Z is a one, the phase step value 232 may be determined to be positive or forward. In the example context, since the divider power 220 is three (e.g. P=3) and the power of two of the internal phase control resolution is six (e.g. R=6), the saturate module may perform a modulo $2^9$ on the difference value 230 and determine the value of the eighth bit.

The adder modulo 210 may operate to add the step phase value 232 to the current phase control value 228 stored in the current phase control value register 212. The adder modulo 210 may then determine Y modulo $2^{P+R}$, where Y is the sum of value 232 and value 228 and output the result as the modified phase control value 234. The adder modulo 210 may perform the modulo operation to wrap the modified phase control value, for example, when the step from the current phase control value 228 to the modified control value 234 crosses zero and one or more of the most significant bits are not in use. For example, in the example context, the phase control target value 226 and the current phase control value 228 are 11-bit values but the internal phase control resolution is $2^9$. As such, the two most significant bits are not in use and, if not cleared, may cause the difference 230 to be incorrectly calculated on the next iteration. The adder modulo 210 may output the modified phase control value 234 to the current phase control value register 212 and the mask module 214.

The current phase control value register 212 may update the current phase control value to the value of the modified phase control value 234. As such, in the next iteration, the value 228 output by the register 212 may be the value of the modified phase control value 234.

The mask module 214 may perform a mask operation on the modified phase control value 234 to generate the masked phase control value 238. In some embodiments, the mask operation may wrap the modified phase control value 234 to the range of phase ($2^R$) provided by the phase interpolator 216 for the internal clock frequency. In the example context discussed above, the phase interpolator 216 provides $2^6$ phases at the internal clock frequency. As such, in the example context, the mask operation may output the six least significant bits of the modified phase control value 234 as the masked phase control value 236.

The phase interpolator 216 may be a module capable of synthesizing the phase controlled clock signal 224 at the internal clock frequency with a range of phase offsets from the clock signal from the high speed clock generator. In some embodiments, the phase interpolator 216 generates the phase control clock 224 with a phase offset based on the masked phase control value 236. For example, the phase offset may be determined as W where:

$$W = \frac{2\pi V}{2^R} \text{ radians}$$

where V is the value of the masked phase control value 236.

Figure 3:
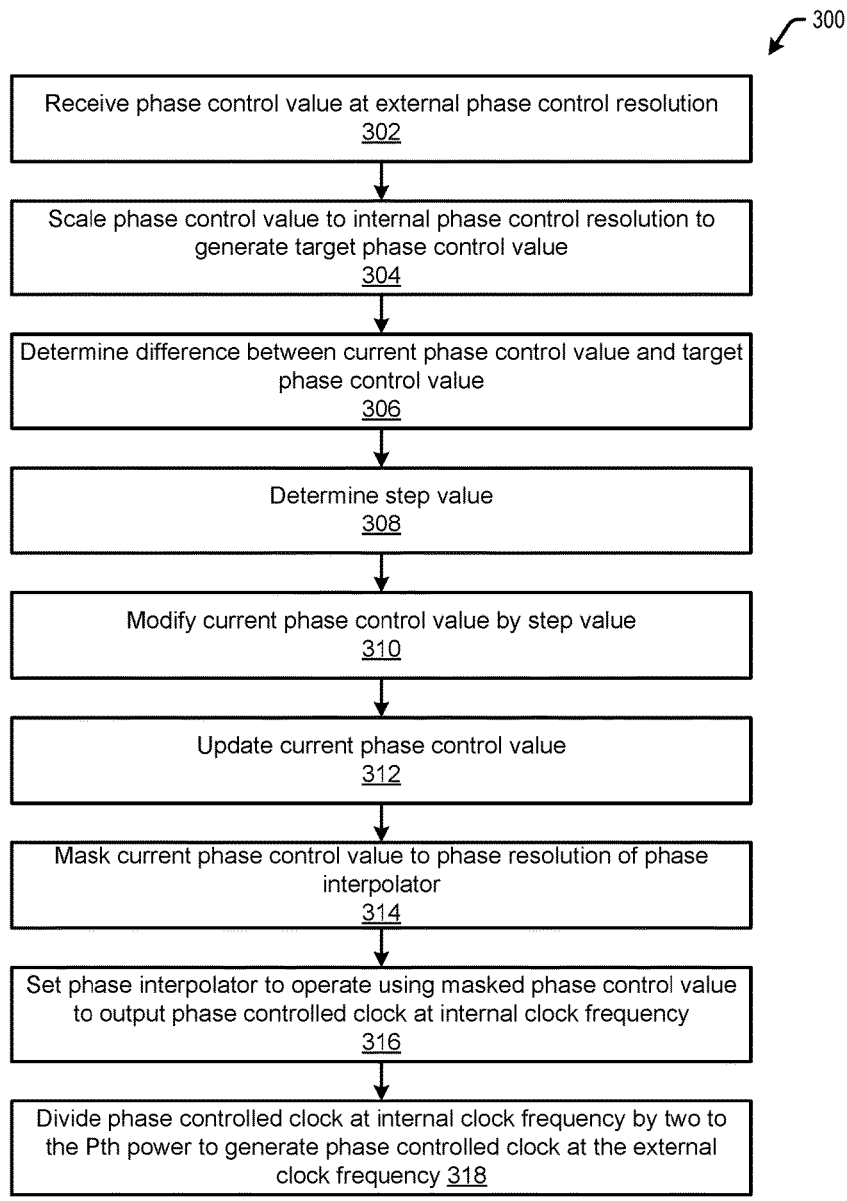
FIG. 3 is a flowchart of a method of a tunable clock generator with phase control, in accordance with certain embodiments of the present disclosure.

Referring to FIG. 3, a flowchart of a method of a tunable clock generator with phase control is shown and is generally designated 300. The method 300 can be an embodiment of the systems 100 and 200.

At 302, the digital-to-phase converter may receive a phase control value at an external phase control resolution. The digital to phase converter may then scale the phase control value to the internal phase control resolution to generate a target phase control value at 304.

At 306, the digital-to-phase converter may determine a difference between the current phase control value and the target phase control value. Based on the difference, the digital-to-phase converter may determine a step value at 308, for example, in the manner discussed above with regard to FIG. 2. At 310, the digital-to-phase converter may modify the current phase control value by the step value and, at 312, update the current phase control value.

At 314, the digital-to-phase converter may mask the modified phase control value to a phase resolution of the phase interpolator. At 316, the digital-to-phase converter may set the phase interpolator to operate using the masked phase control value to output the phase controlled clock at internal clock frequency.

At 318, the frequency divider may divide the phase controlled clock at the internal clock frequency by $2^P$ to generate the phase controlled clock at the external clock frequency.

All steps listed for the method 300 may be applied to systems that have clock generators. This and other variations would be apparent to one of ordinary skill in the art in view of this specification. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 4:
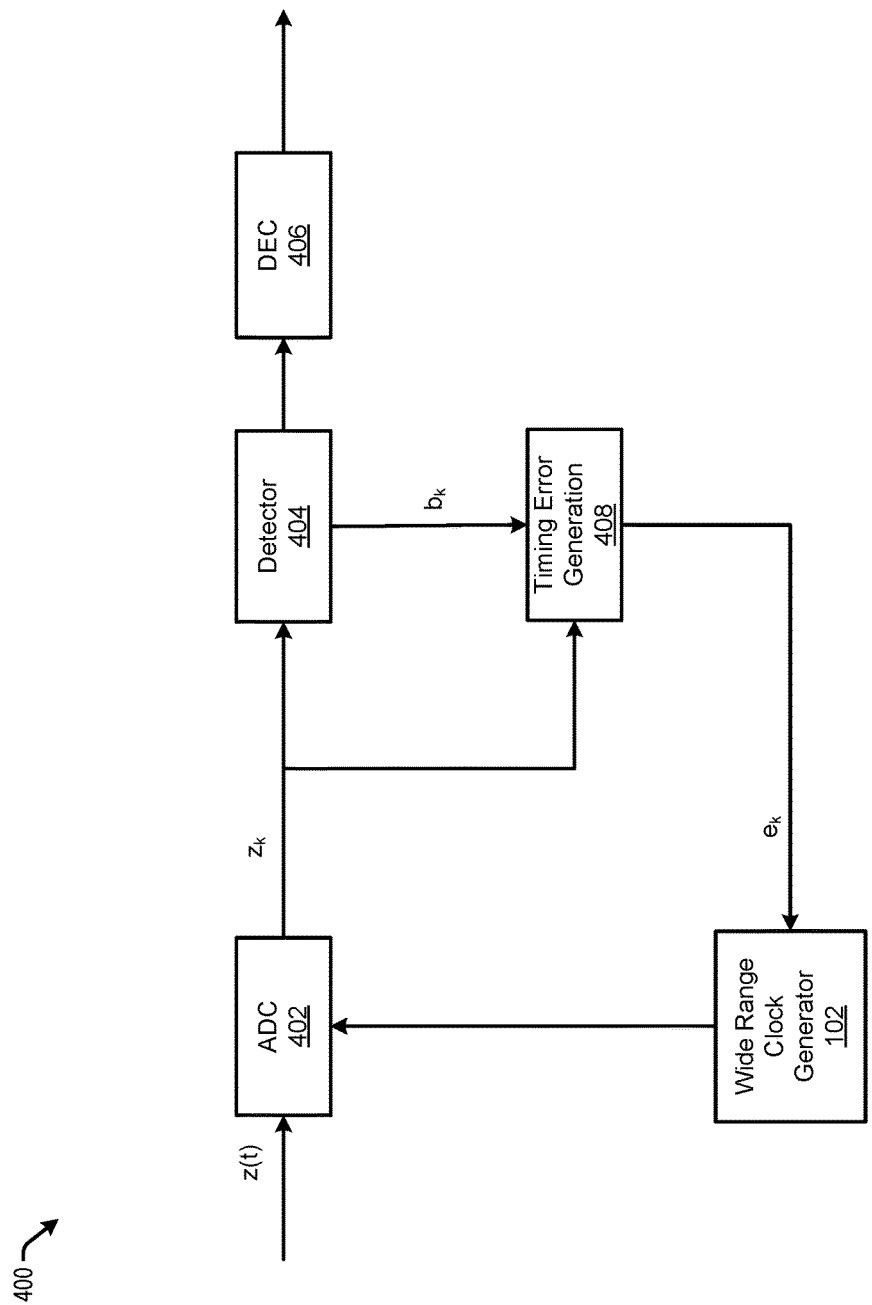
FIG. 4 is a block diagram of a system including a tunable clock generator with phase control, in accordance with certain embodiments of the present disclosure.

FIG. 4 is a diagram of a system including a tunable clock generator with phase control, generally designated 400, in accordance with certain embodiments of the present disclosure. In particular, system 400 may include portions of a read/write channel of a hard drive. System 400 may include a wide range clock generator 102 that may correspond to certain embodiments of system 100 and system 200 from FIGS. 1 and 2. A signal z(t) may be provided to the ADC 402. The ADC 402 may provide a digitized sample sequence $z_k$ to the detector 404 and the timing error generation module 408. The detector may provide estimates of the received data sequence ($b_k$) to the decoder 406, as well as to the timing error generation module 408. The timing error generation module 408 may generate a timing error ($e_k$) based on the digitized samples and estimates of the written or transmitted data sequence ($b_k$). The timing errors may then be applied as a phase control value ($e_k$) to the wide range clock generator 102. The wide range clock generator 102 may also receive a divider power value (not shown) indicating the ratio of the clock frequency of the sampling clock to be output to the ADC 402 (e.g. the external clock frequency) to the internal clock frequency of the wide range clock generator 102. As such, the phase of the sampling clock supplied to the ADC 402 by the wide range clock generator can be adjusted to drive the timing error (e.g. the phase control value ($e_k$)) to zero.

Figure 5:
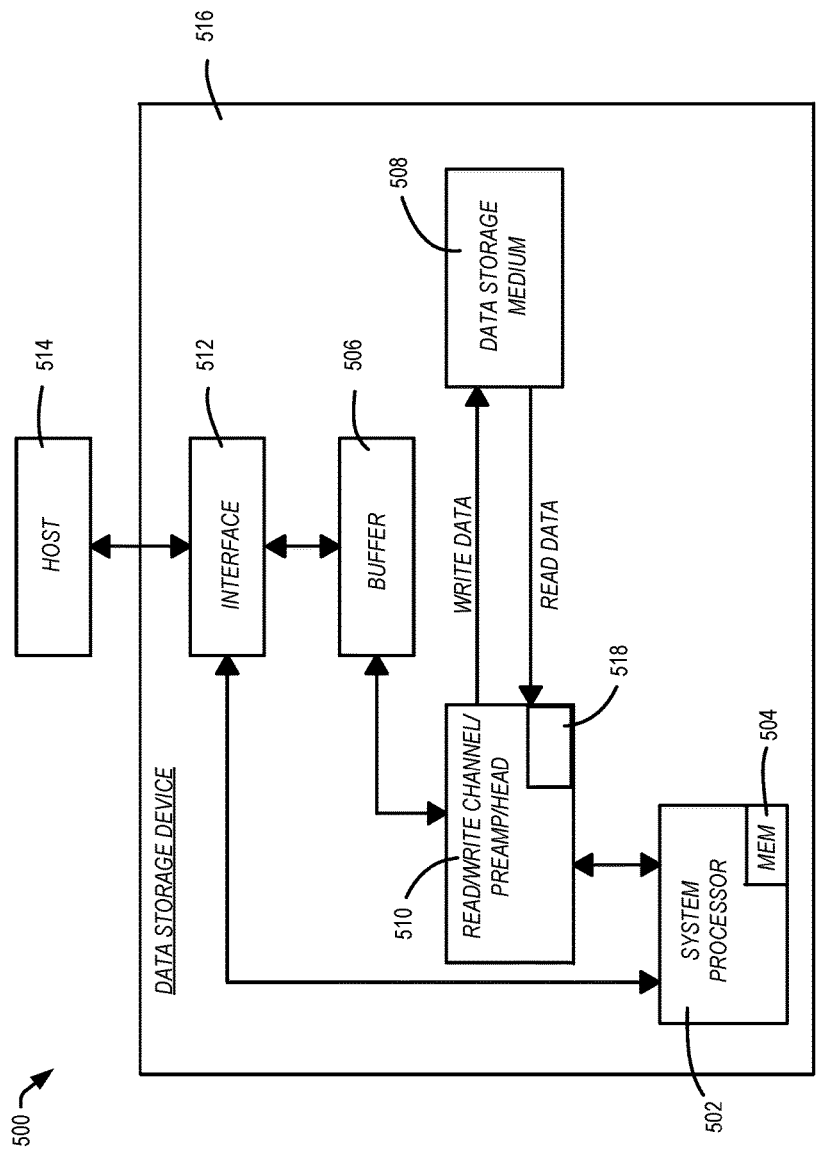
FIG. 5 is a block diagram of a system including a tunable clock generator with phase control, in accordance with certain embodiments of the present disclosure.

Referring to FIG. 5, a block diagram of a system including a tunable clock generator with phase control is shown and generally designated 500. The system 500 can be an example of a data storage device (DSD), and may be an example implementation of systems 100, 200 and 400. The DSD 516 can optionally connect to and be removable from a host device 514, which can be a device or system having stored data, such as a desktop computer, a laptop computer, a server, a digital video recorder, a photocopier, a telephone, a music player, other electronic devices or systems not listed, or any combination thereof. The data storage device 516 can communicate with the host device 514 via the hardware/firmware based host interface circuit 512 that may include a connector (not shown) that allows the DSD 516 to be physically connected and disconnected from the host 514.

The DSD 516 can include a system processor 502, which may be a programmable controller, and associated memory 504. The system processor 502 may be part of a system on chip (SOC). A buffer 506 may temporarily store data during read and write operations and can include a command queue. The read/write (R/W) channel/preamp/head 510 can encode data during write operations to, and reconstruct data during read operations from, the data storage medium 508. The data storage medium 508 is shown and described as a hard disc drive, but may be other types of medium, such as a flash medium, optical medium, or other medium, or any combination thereof.

The R/W channel/preamp/head 510 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel/preamp/head 510 can combine multiple inputs and provide a single output.

The block 518 can implement all of or part of the systems and functionality of systems and methods 100-400. In some embodiments, the block 518 may be a separate circuit, integrated into the R/W channel/preamp/head 510, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a wide range clock generator circuit configured to:
      generate a target phase control value at an internal phase control resolution of an internal clock frequency based on a phase control value at an external phase control resolution of an external clock frequency;

determine a phase step value based on a current phase control value and the target phase control value;

generate a modified phase control value based on the current phase control value and the phase step value;

generate a phase controlled clock signal at the internal clock frequency using the modified phase control value;

generate a phase controlled clock signal at the external clock frequency based on the phase controlled clock signal at the internal clock frequency; and output the phase controlled clock signal at the external clock frequency as a phase-locked-loop output clock.

2. The apparatus of claim 1, comprising the circuit further configured to:

generate the phase controlled clock signal at the internal clock frequency by offsetting a phase of the phase controlled clock signal at the internal clock frequency from a phase of an internal clock signal by the modified phase control value.

3. The apparatus of claim 1, comprising the circuit further configured to:

determine another phase step value based on the modified phase control value and the target phase control value;

generate another modified control phase value based on the modified phase control value and the other phase step value; and generate the phase controlled clock signal at the internal clock frequency using the other modified phase control value.

4. The apparatus of claim 1, comprising the circuit further configured to:

perform the determining the phase step value by determining a direction of the phase step value based on a result of a modulo operation on a difference between the current phase control value and the target phase control value.

5. The apparatus of claim 1, comprising the circuit further configured to:

perform generating of the target phase control value at the internal phase control resolution of the internal clock frequency by scaling the phase control value based on a ratio of the external clock frequency to the internal clock frequency to generate target phase control value.

6. The apparatus of claim 1, further comprising:

the internal clock frequency being faster than the external clock frequency, a ratio of the internal clock frequency to the external clock frequency being a power of two.

7. The apparatus of claim 1, comprising the circuit further configured to:

receive a ratio value specifying a ratio of the internal clock frequency to the external clock frequency as a power of two; and perform the generating of the phase controlled clock signal at the external clock frequency based on the phase controlled clock signal at the internal clock frequency by dividing the phase controlled clock signal at the internal clock frequency based on the received ratio value.

8. An apparatus comprising:

a wide range clock generator circuit including:

an internal clock configured to generate an internal clock signal at an internal clock frequency;

a digital to phase circuit configured to:

generate a target phase control value at an internal phase control resolution of the internal clock frequency based on a phase control value at an external phase control resolution of an external clock frequency;

determine a phase step value based on a current phase control value and the target phase control value;

generate a modified phase control value based on the current phase control value and the phase step value;

generate a phase controlled clock signal at the internal clock frequency using the modified phase control value; and a frequency divider configured to:

generate a phase controlled clock signal at the external clock frequency based on the phase controlled clock signal at the internal clock frequency; and output the phase controlled clock signal at the external clock frequency as a phase-locked-loop output clock.

9. The apparatus of claim 8, comprising the digital to phase circuit further configured to:

generate the phase controlled clock signal at the internal clock frequency by offsetting a phase of the phase controlled clock signal at the internal clock frequency from a phase of the internal clock signal by the modified phase control value.

10. The apparatus of claim 9, comprising the digital to phase circuit further configured to:

determine another phase step value based on the modified phase control value and the target phase control value;

generate another modified control phase value based on the modified phase control value and the other phase step value;

generate the phase controlled clock signal at the internal clock frequency using the other modified phase control value.

11. The apparatus of claim 10, comprising the digital to phase circuit further configured to:

perform the determining the other phase step value by determining a direction of the other phase step value based on a result of a modulo operation on a difference between the modified phase control value and the target phase control value.

12. The apparatus of claim 11, comprising the digital to phase circuit further configured to:

perform generating of the target phase control value at the internal phase control resolution of the internal clock frequency by scaling the phase control value based on a ratio of the external clock frequency to the internal clock frequency to generate target phase control value.

13. The apparatus of claim 9, further comprising the internal clock frequency being faster than the external clock frequency, a ratio of the internal clock frequency to the external clock frequency being a power of two.

14. The apparatus of claim 8, comprising the frequency divider further configured to:

receive a ratio value specifying a ratio of the internal clock frequency to the external clock frequency as a power of two; and perform the generating of the phase controlled clock signal at the external clock frequency based on the phase controlled clock signal at the internal clock frequency by dividing the phase controlled clock signal at the internal clock frequency based on the received ratio value.

15. A method comprising:

generating a target phase control value at an internal phase control resolution of an internal clock frequency based on a phase control value at an external phase control resolution of an external clock frequency;

determining a phase step value based on a current phase control value and the target phase control value;

generating a modified phase control value based on the current phase control value and the phase step value;

generating a phase controlled clock signal at the internal clock frequency using the modified phase control value;

generating a phase controlled clock signal at the external clock frequency based on the phase controlled clock signal at the internal clock frequency.

16. The method of claim 15, further comprising:

the generating the phase controlled clock signal at the internal clock frequency being performed by offsetting a phase of the phase controlled clock signal at the internal clock frequency from a phase of an internal clock signal by the modified phase control value.

17. The method of claim 16, further comprising:

outputting the phase controlled clock signal at the external clock frequency as a phase locked loop output clock.

18. The method of claim 16, further comprising:

determining another phase step value based on the modified phase control value and the target phase control value;

generating another modified control phase value based on the modified phase control value and the other phase step value;

generating the phase controlled clock signal at the internal clock frequency using the other modified phase control value.

19. The method of claim 16, further comprising:

the determining the phase step value determines a direction of the phase step value based on a result of a modulo operation on a difference between the current phase control value and the target phase control value.

20. The method of claim 15, further comprising:

receiving a ratio value specifying a ratio of the internal clock frequency to the external clock frequency as a power of two; and performing the generating of the phase controlled clock signal at the external clock frequency based on the phase controlled clock signal at the internal clock frequency by dividing the phase controlled clock signal at the internal clock frequency based on the received ratio value.

* * * * *